(12) United States Patent
Kim

(10) Patent No.: US 9,224,979 B2
(45) Date of Patent: Dec. 29, 2015

(54) DISPLAY DEVICE AND MANUFACTURING METHOD OF THE SAME

(71) Applicant: SAMSUNG DISPLAY CO., LTD., Yongin, Gyeonggi-Do (KR)

(72) Inventor: Min Ki Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/457,816

(22) Filed: Aug. 12, 2014

(65) Prior Publication Data

US 2015/0188081 A1 Jul. 2, 2015

(30) Foreign Application Priority Data

Dec. 31, 2013 (KR) .................. 10-2013-0169358

(51) Int. Cl.
| | | |
|---|---|---|
| H01L 29/08 | (2006.01) | |
| H01L 29/04 | (2006.01) | |
| H01L 33/00 | (2010.01) | |
| H01L 51/52 | (2006.01) | |
| H01L 51/56 | (2006.01) | |

(52) U.S. Cl.
CPC ........ *H01L 51/5246* (2013.01); *H01L 51/5293* (2013.01); *H01L 51/56* (2013.01)

(58) Field of Classification Search
CPC . H01L 51/50; H01L 51/5237; H01L 51/5246; H01L 27/323; H01L 27/3272; H01L 27/3244; H01L 51/5281; H01L 27/1214; H01L 27/12
USPC .............. 257/40, 59, 98, 99, 100, E33.001, 257/E27.111; 361/679.01; 313/112, 504; 348/58; 362/97.2, 97.3
See application file for complete search history.

(56) References Cited

U.S. PATENT DOCUMENTS

| | | | |
|---|---|---|---|
| 5,936,600 A * | 8/1999 | Ohashi et al. ................... 345/87 |
| 2004/0080267 A1* | 4/2004 | Cok ............................... 313/512 |
| 2006/0158579 A1* | 7/2006 | Hasegawa ....................... 349/58 |
| 2008/0201999 A1* | 8/2008 | Chung et al. ......................... 40/1 |
| 2009/0237602 A1* | 9/2009 | Kubota et al. .................. 349/122 |
| 2010/0315570 A1* | 12/2010 | Mathew et al. .................. 349/58 |
| 2011/0103041 A1* | 5/2011 | Mathew et al. ............... 362/97.3 |
| 2011/0222218 A1* | 9/2011 | Kim et al. ................ 361/679.01 |
| 2011/0242655 A1* | 10/2011 | Jung et al. ................ 359/488.01 |

FOREIGN PATENT DOCUMENTS

| | | |
|---|---|---|
| KR | 10-2010-0108125 A | 10/2010 |
| KR | 10-2011-0110593 A | 10/2011 |
| KR | 10-2012-0004862 A | 1/2012 |
| KR | 10-1279224 B1 | 6/2013 |

* cited by examiner

*Primary Examiner* — Long K Tran
*Assistant Examiner* — Dzung Tran
(74) *Attorney, Agent, or Firm* — Christie, Parker & Hale, LLP

(57) ABSTRACT

A display device, including: a substrate; a display panel formed on the substrate; a resin layer positioned on the display panel; a polarizer positioned on the resin layer; a window positioned on the polarizer; a first adhesive layer interposed between the window and the polarizer; a printing layer positioned either between the first adhesive layer and the polarizer or between the polarizer and the resin layer; and a supporter surrounding the display panel and the resin layer and supporting the window, in which the printing layer is positioned to correspond to an edge region of the window.

10 Claims, 8 Drawing Sheets

DISPLAY DEVICE AND MANUFACTURING METHOD OF THE SAME

CROSS-REFERENCE TO RELATED APPLICATION

This application claims priority to and the benefit of Korean Patent Application No. 10-2013-0169358 filed in the Korean Intellectual Property Office on Dec. 31, 2013, the entire content of which is incorporated herein by reference.

BACKGROUND

1. Field

The present disclosure relates to a display device and a manufacturing method of the display device.

2. Description of the Related Art

Display devices which are currently known include a liquid crystal display (LCD), a plasma display panel (PDP), an organic light emitting diode device (OLED device), a field effect display (FED), an electrophoretic display device, and the like.

Particularly, the OLED device includes two electrodes and an organic emission layer positioned therebetween, and an electron injected from one electrode and a hole injected from the other electrode are coupled with each other in the organic emission layer to generate an exciton, and the exciton emits energy to emit light.

Since the OLED device has a self-luminance characteristic and does not require a separate light source unlike the LCD, a thickness and a weight thereof may be reduced. Further, since the OLED device has high-grade characteristics such as low power consumption, high luminance, and a high response speed, the OLED device receives attention as a next-generation display device.

Such a display device is formed by laminating a display panel, a polarizer, a resin layer, and a window on a substrate in sequence. In addition, a printing layer is formed at a lower edge of the window to prevent the lower portion of the window from being observed from (exposed to) the outside. In this case, the edge of the polarizer is positioned inside the printing layer.

However, there is a problem in that the edge of the polarizer positioned inside the printing layer is observed from (exposed to) the outside when a user views the edge from the top of the window in an oblique direction.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention are directed toward a display device and a manufacturing method thereof having advantages of preventing an edge of a polarizer covered by a printing layer formed below a window from being observed or exposed, when obliquely viewed from the outside of the display device.

An exemplary embodiment provides a display device, including: a substrate; a display panel formed on the substrate; a resin layer positioned on the display panel; a polarizer positioned on the resin layer; a window positioned on the polarizer; a first adhesive layer interposed between the window and the polarizer; a printing layer positioned either between the first adhesive layer and the polarizer or between the polarizer and the resin layer; and a supporter surrounding the display panel and the resin layer and supporting the window, in which the printing layer is positioned to correspond to an edge region of the window.

In this case, an area of the polarizer may be larger than areas of the resin layer and the display panel.

In this case, the area of the polarizer may correspond to an area of the window.

Meanwhile, the polarizer may be supported by the supporter.

In this case, the display device may further include a second adhesive layer interposed between the polarizer and the supporter.

In this case, the second adhesive layer may be a double-sided tape.

Meanwhile, the display panel may include an organic light emitting element.

Meanwhile, the first adhesive layer may be an optical clear adhesive.

Meanwhile, the polarizer may include a linear polarization member and a phase retardation film disposed below the linear polarization member.

In this case, the phase retardation film may be a λ/4 phase retardation film.

In this case, the polarizer may further include a first polarizer adhesive layer formed on the linear polarization member.

In this case, the polarizer may further include a second polarizer adhesive layer formed between the linear polarization member and the λ/4 phase retardation film.

Another exemplary embodiment provides a manufacturing method of a display device, including: preparing a substrate; preparing a window with a polarizer disposed on one side of the window; forming a display panel on the substrate; coating a resin layer on the display panel; disposing the substrate, the display panel, and the resin layer inside a supporter surrounding the substrate, the display panel, and the resin layer; attaching the window so that the polarizer faces the supporter and the resin layer; and curing the resin layer.

In this case, a first adhesive layer may be interposed between the window and the polarizer.

In this case, a printing layer may be positioned between the polarizer and the resin layer, and the printing layer may be positioned to correspond to an edge region of the window.

Meanwhile, a printing layer may be positioned between the polarizer and the first adhesive layer, and the printing layer may be positioned to correspond to an edge region of the window.

Meanwhile, the curing of the resin layer may be performed by irradiating ultraviolet rays to the resin layer.

According to the exemplary embodiment, it is possible to prevent an edge of a polarizer positioned below a window from being misrecognized as a defect of the display device by preventing the edge from being exposed, when obliquely viewed from the outside of the display device.

DETAILED DESCRIPTION

Figure 1:
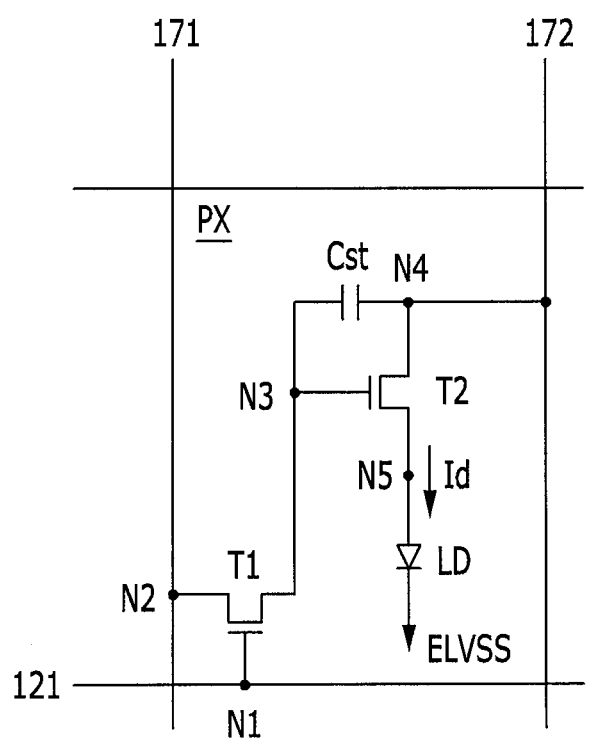
FIG. 1 is an equivalent circuit diagram of one pixel of an organic light emitting diode device.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

Figure 4:
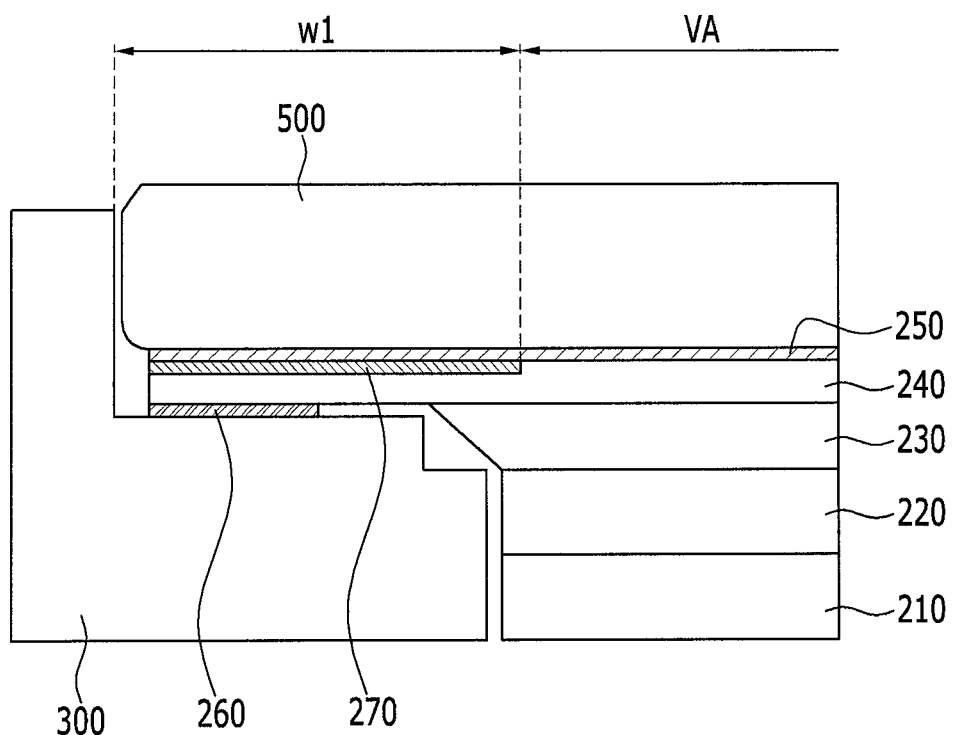
FIG. 4 is a partial cross-sectional view of a display device according to an exemplary embodiment.
Figure 5:
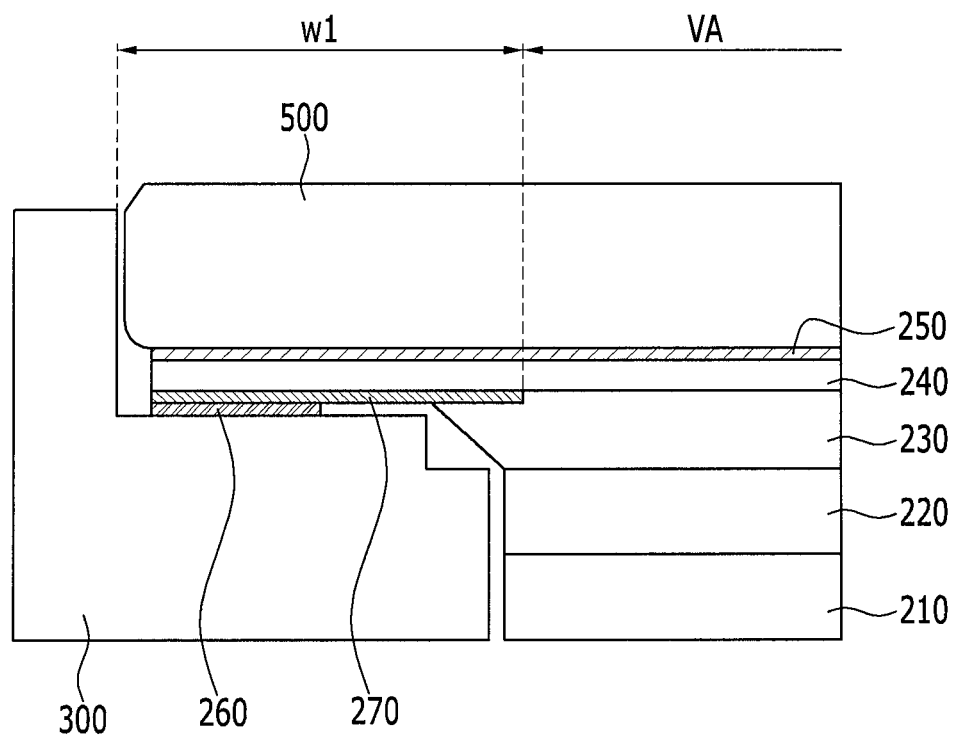
FIG. 5 is a partial cross-sectional view of a display device according to another exemplary embodiment.

Referring to FIGS. 4 and 5, in a display device according to an exemplary embodiment, a polarizer 240 is positioned between a window 500 and a resin layer 230, and an area of the polarizer 240 is largely formed to correspond to an area of the window 500 to prevent an edge of the polarizer 240 from being observed from (exposed to) the outside.

Initially, a display panel configured as a display device according to an exemplary embodiment will be described with reference to FIGS. 1 and 2. Here, the display panel may correspond to a display panel 220 of FIG. 4.

The display device described with reference to FIGS. 1 and 2 relates to an organic light emitting diode (OLED) device.

However, the display device according to the exemplary embodiment is not limited thereto, but a liquid crystal display (LCD), a plasma display panel (PDP), a field effect display (FED), an electrophoretic display device, and the like may be applied.

FIG. 1 is an equivalent circuit diagram of one pixel of an organic light emitting diode device. FIG. 2 is a cross-sectional view of the organic light emitting diode device.

Referring to FIG. 1, the organic light emitting diode device includes a plurality of signal lines 121, 171, and 172, and a pixel PX connected thereto. The pixel PX may be one of a red pixel R, a green pixel G, and a blue pixel B.

The signal lines include a scanning signal line 121 transferring a gate signal (or scanning signal), a data line (or data signal line) 171 transferring a data signal, and a driving voltage line (or driving voltage signal line) 172 transferring a driving voltage. The scanning signal lines 121 extend substantially in a row direction and are substantially parallel to each other, and the data lines 171 extend substantially in a column direction and are substantially parallel to each other. The driving voltage lines 172 extend substantially in a column direction, but may extend in a row direction or a column direction or be formed in a net shape.

In this case, one pixel PX includes a thin film transistor including a switching transistor T1 and a driving transistor T2, a storage capacitor Cst, and an organic light emitting element LD. Although not illustrated, one pixel PX may further include a thin film transistor and a capacitor in order to compensate for a current provided in the organic light emitting element.

The switching transistor T1 has a control terminal N1, an input terminal N2, and an output terminal N3, and the control terminal N1 is connected to the scanning signal line 121, the input terminal N2 is connected to the data line 171, and the output terminal N3 is connected to the driving transistor T2. The switching transistor T1 transfers the data signal received from the data line 171 to the driving transistor T2 in response to the scanning signal received from the scanning signal line 121.

In addition, the driving transistor T2 also has a control terminal N3, an input terminal N4, and an output terminal N5. Here, the control terminal N3 is connected to the switching transistor T1, the input terminal N4 is connected to the driving voltage line 172, and the output terminal N5 is connected to the organic light emitting element LD. The driving transistor T2 allows an output current Id (with amplitude that varies according to a voltage applied between the control terminal N3 and the output terminal N5) to flow.

In this case, the capacitor Cst is connected between the control terminal N3 and the input terminal N4 of the driving transistor T2. The capacitor Cst charges the data signal applied to the control terminal N3 of the driving transistor T2, and maintains the charged data signal even after the switching transistor T1 is turned off.

Meanwhile, the organic light emitting element LD, for example, as an organic light emitting diode (OLED), has an anode connected to the output terminal N5 of the driving transistor T2 and a cathode connected to a common voltage source ELVSS. The organic light emitting element LD emits light by varying intensities according to the output current Id of the driving transistor T2 to display an image.

The organic light emitting element LD may include an organic material which uniquely expresses any one or one or more of the primary colors such as three primary colors of red, green, and blue, and the organic light emitting diode device displays a desired image by a spatial sum of the colors.

The switching transistor T1 and the driving transistor T2 are n-channel field effect transistors (FET), but at least one thereof may be a p-channel field effect transistor. Further, a connection relationship of the transistors T1 and T2, the capacitor Cst, and the organic light emitting diode LD may be changed.

Hereinafter, the organic light emitting diode device will be described with reference to a cross-sectional view illustrated in FIG. 2.

Figure 2:
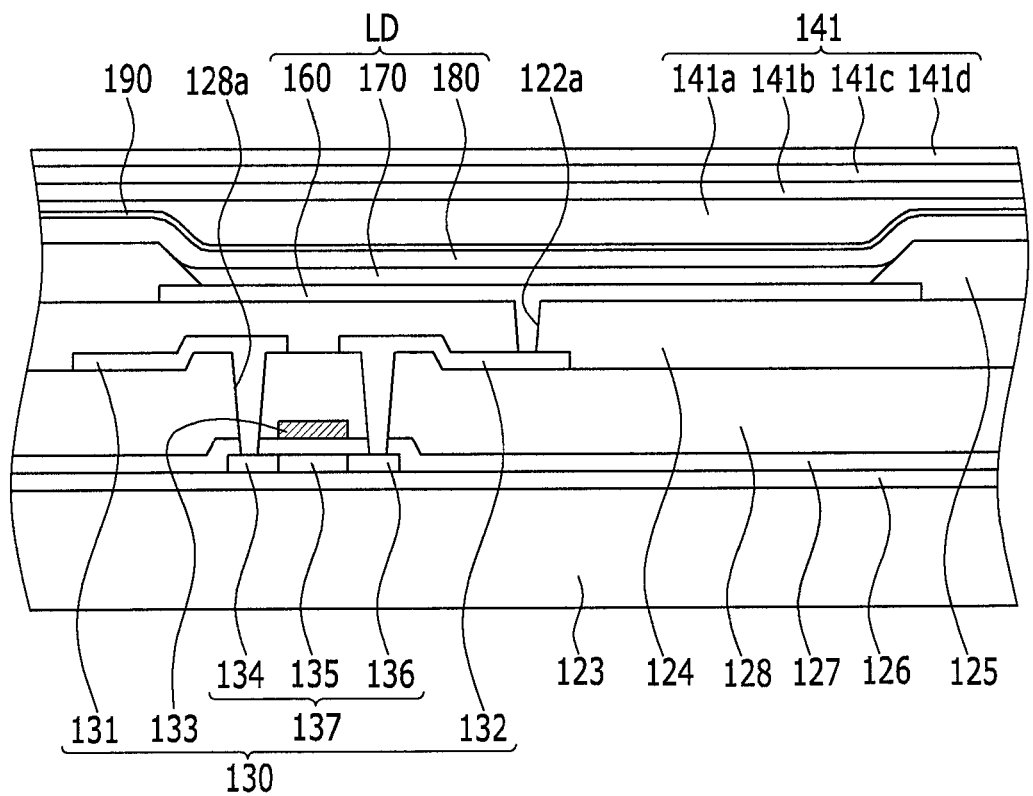
FIG. 2 is a cross-sectional view of the organic light emitting diode device.

Referring to FIG. 2, a substrate 123 is formed as an insulating substrate made of glass, quartz, ceramics, metal, plastic, and/or the like. However, the exemplary embodiment is not limited thereto, and the substrate 123 may be formed as a metallic substrate made of stainless steel or the like. Meanwhile, the substrate 123 may correspond to a substrate 210 of FIG. 4.

In addition, a substrate buffer layer 126 is formed on the substrate 123. The substrate buffer layer 126 serves to prevent penetration of impure elements and planarize the surface.

In this case, the substrate buffer layer 126 may be made of various materials capable of performing the functions. For example, one of a silicon nitride ($SiN_x$) layer, a silicon oxide ($SiO_x$, such as $SiO_2$) layer, and a silicon oxynitride ($SiO_xN_y$) layer may be used as the substrate buffer layer 126. However, the substrate buffer layer 126 is not a necessarily required configuration, and may be omitted according to a kind of substrate 123 and a process condition.

A driving semiconductor layer 137 is formed on the substrate buffer layer 126.

The driving semiconductor layer 137 is formed as a polysilicon layer. Further, the driving semiconductor layer 137 includes a channel region 135 in which impurities are not doped, and a source region 134 and a drain region 136 in which the impurities are doped at both sides of the channel region 135. In this case, the doped ion materials are P-type (P-channel) impurities such as boron (B), and $B_2H_6$ is mainly used. Here, the impurities vary according to a kind of thin film transistor.

A gate insulating layer 127 made of silicon nitride (SiNx) or silicon oxide ($SiO_2$) is formed on the driving semiconductor layer 137. A gate wire including a driving gate electrode 133 is formed on the gate insulating layer 127. In addition, the driving gate electrode 133 is formed to overlap at least a part of the driving semiconductor layer 137, particularly, the channel region 135.

Meanwhile, an interlayer insulating layer 128 covering the driving gate electrode 133 is formed on the gate insulating layer 127. Contact holes 128a exposing the source region 134 and the drain region 136 of the driving semiconductor layer 137 are formed in the gate insulating layer 127 and the interlayer insulating layer 128. The interlayer insulating layer 128 may be formed by using (utilizing) a ceramic-based material such as silicon nitride ($SiN_x$) or silicon oxide ($SiO_2$), like the gate insulating layer 127.

In addition, a data wire including a driving source electrode 131 and a driving drain electrode 132 is formed on the interlayer insulating layer 128. Further, the driving source electrode 131 and the driving drain electrode 132 are connected with the source region 134 and the drain region 136 of the driving semiconductor layer 137 through the contact holes 128a formed in the interlayer insulating layer 128 and the gate insulating layer 127, respectively.

As such, the driving thin film transistor 130 including the driving semiconductor layer 137, the driving gate electrode 133, the driving source electrode 131, and the driving drain electrode 132 is formed. The configuration of the driving thin film transistor 130 is not limited to the aforementioned example, and may be variously modified as a known configuration which may be easily implemented by those skilled in the art.

In addition, a planarization layer 124 covering the data wire is formed on the interlayer insulating layer 128. The planarization layer 124 serves to remove and planarize a step in order to increase emission efficiency of the organic light emitting element to be formed thereon. Further, the planarization layer 124 has an electrode via hole 122a exposing a part of the drain electrode 132.

The planarization layer 124 may be made of one or more materials selected from polyacrylate resin, epoxy resin, phenolic resin, polyamide resin, polyimide resin, unsaturated polyester resin, poly phenylenether resin, poly phenylenesulfide resin, and benzocyclobutene (BCB).

Here, an exemplary embodiment according to the present invention is not limited to the aforementioned structure, and in some cases, one of the planarization layer 124 and the interlayer insulating layer 128 may be omitted.

In this case, a first electrode of the organic light emitting element, that is, a pixel electrode 160 is formed on the planarization layer 124. That is, the organic light emitting diode device includes a plurality of pixel electrodes 160 which is disposed for every plurality of pixels, respectively. In this case, the plurality of pixel electrodes 160 is spaced apart from each other. The pixel electrode 160 is connected to the drain electrode 132 through the electrode via hole 122a of the planarization layer 124.

Further, a pixel defining layer 125 having an opening exposing the pixel electrode 160 is formed on the planarization layer 124. That is, the pixel defining layer 125 has a plurality of openings formed for each pixel. In this case, the organic emission layer 170 may be formed for each opening formed by the pixel defining layer 125. Accordingly, a pixel area in which each organic emission layer is formed by the pixel defining layer 125 may be defined.

In this case, the pixel electrode 160 is disposed to correspond to the opening of the pixel defining layer 125. However, the pixel electrode 160 is not necessarily disposed only in the opening of the pixel defining layer 125, but may be disposed below the pixel defining layer 125 so that a part of the pixel electrode 160 overlaps with the pixel defining layer 125.

The pixel defining layer 125 may be made of resin such as polyacrylates resin and polyimdes, a silica-based inorganic material, and/or the like.

Meanwhile, an organic emission layer 170 is formed on the pixel electrode 160.

In addition, a second electrode, that is, a common electrode 180 may be formed on the organic emission layer 170. As such, the organic light emitting diode LD (including the pixel electrode 160, the organic emission layer 170, and the common electrode 180) is formed.

In this case, each of the pixel electrode 160 and the common electrode 180 may be made of a transparent conductive material or a transflective or reflective conductive material. According to a kind of materials forming the pixel electrode 160 and the common electrode 180, the organic light emitting diode device may be a top emission device, a bottom emission device, or a double-sided emission device.

Meanwhile, an overcoat 190 covering and protecting the common electrode 180 may be formed as an organic layer on the common electrode 180.

In addition, a thin film encapsulation layer 141 is formed on the overcoat 190. The thin film encapsulation layer 141 encapsulates and protects the organic light emitting element LD and a driving circuit part formed on the substrate 123 from the outside.

The thin film encapsulation layer 141 includes encapsulation organic layers 141a and 141c and encapsulation inorganic layers 173 and 121d which are alternately laminated. In FIG. 2, for example, a case where two encapsulation organic layers 141a and 141c and two encapsulation inorganic layers 141b and 141d are alternately laminated to configure the thin film encapsulation layer 141 is illustrated, but is not limited thereto.

Also, referring to FIG. 4, a resin layer 230 is formed on a display panel 220. The resin layer 230 may bond a window 500 to which a polarizer 240 is attached and the display panel 220.

In this case, the resin layer 230 may be formed by curing a liquid resin.

In addition, the polarizer 240 may be positioned on the resin layer 230. The polarizer 240 converts an optical axis of light emitted to the outside through the display panel 220.

Figure 8:
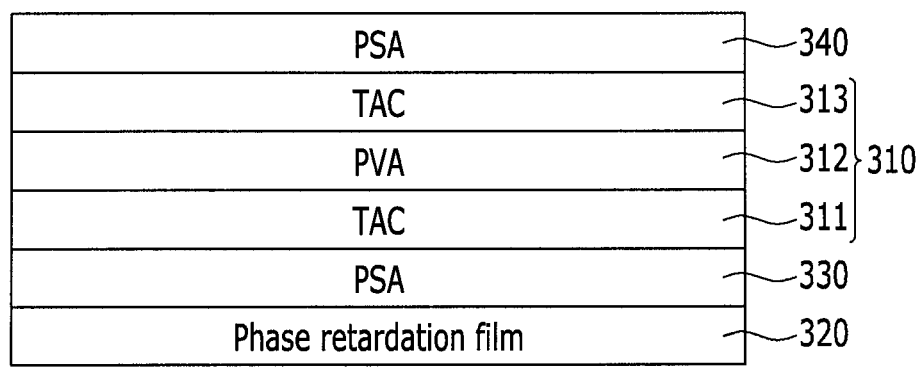

Referring to FIG. 8, the configuration of the polarizer 240 according to the exemplary embodiment will be described. The polarizer 240 includes a linear polarization member 310 and a phase retardation film 320 disposed below the linear polarization member 310.

The linear polarization member 310 includes a polarizer layer 312, and a lower supporter 311 and an upper supporter 313 supporting the polarizer layer. The polarizer layer 312 may be made of poly vinylalcohol (PVA), and the lower supporter 311 and the upper supporter 313 may be made of triacetyl cellulous (TAC).

The phase retardation film 320 may be a λ/4 phase retardation film, and serves to convert the linear polarization into a circular polarization, or the circular polarization into the linear polarization.

The phase retardation film 320 may include a birefringence film, an alignment film of a liquid crystal polymer, or a film supporting an alignment layer of the liquid crystal polymer, or the like, which is formed by stretching a film made of a proper polymer, such as polycarbonate or polyvinyl alcohol, polystyrene or polymethyl methacrylate, polypropylene or other polyolefins, or polyacrylate or polyamide.

The polarizer 240 serves as a circular polarizer because the linear polarization member 310 linearly polarizing the light in a set or predetermined direction and a phase retardation film 320 converting the linear polarization into the circular polarization are attached.

A first polarizer adhesive layer 340 is formed above the linear polarization member 310 to attach the linear polarization member 310 and the window 500 to each other. A second polarizer adhesive layer 330 is formed between the linear polarization member 310 and the phase retardation film 320 to attach the linear polarization member 310 and the phase retardation film 320 to each other.

The first polarizer adhesive layer 340 and the second polarizer adhesive layer 330, as pressure sensitivity adhesive layers (PSA), are formed in a film shape including an adhesive, and perform an adhering operation in response to pressure provided from the outside. Such an adhesive may use an acryl-based or rubber-based adhesive having a refractive index in a range of 1.46 to 1.52, an adhesive containing particles such as zirconia in the adhesive in order to adjust the refractive index, or the like.

A protection film for preventing the phase retardation film 320 from being damaged due to a scratch or the like may be attached below the phase retardation film 320. The protection film may be an acetate-based resin such as triacetyl cellulose or a triacetyl cellulous film saponifying on the surface with alkali or the like.

However, the polarizer 240 is not limited thereto, and polarizers having various structures may be used.

Further, a position and a size of the polarizer 240 will be described below in detail.

According to the exemplary embodiment, the window 500 may be disposed on the polarizer 240. The window 500 serves to protect the polarizer 240, the display panel 220, and the like positioned below the window 500.

In this case, the first adhesive layer 250 may be interposed between the window 500 and the polarizer 240. The first adhesive layer 250 bonds the window 500 and the polarizer 240 with each other.

That is, the first adhesive layer 250 is attached to a lower surface of the window 500, and the polarizer 240 may be attached below the window 500 through the first adhesive layer 250.

In this case, the first adhesive layer 250 may be an optical clear (transparent) adhesive.

Meanwhile, according to an exemplary embodiment, as illustrated in FIG. 4, a printing layer 270 is positioned between the first adhesive layer 250 and the polarizer 240.

In this case, the printing layer 270 is formed to correspond to an edge region of the window 500. When viewed from the top of the window 500, the polarizer 240 positioned below the printing layer 270 is not exposed by the printing layer 270.

In this case, a region W1 formed by the printing layer 270 is a region which prevents an inside of the display device from being exposed, as a black region formed at the edge of the window, when viewed from the outside.

Figure 3:
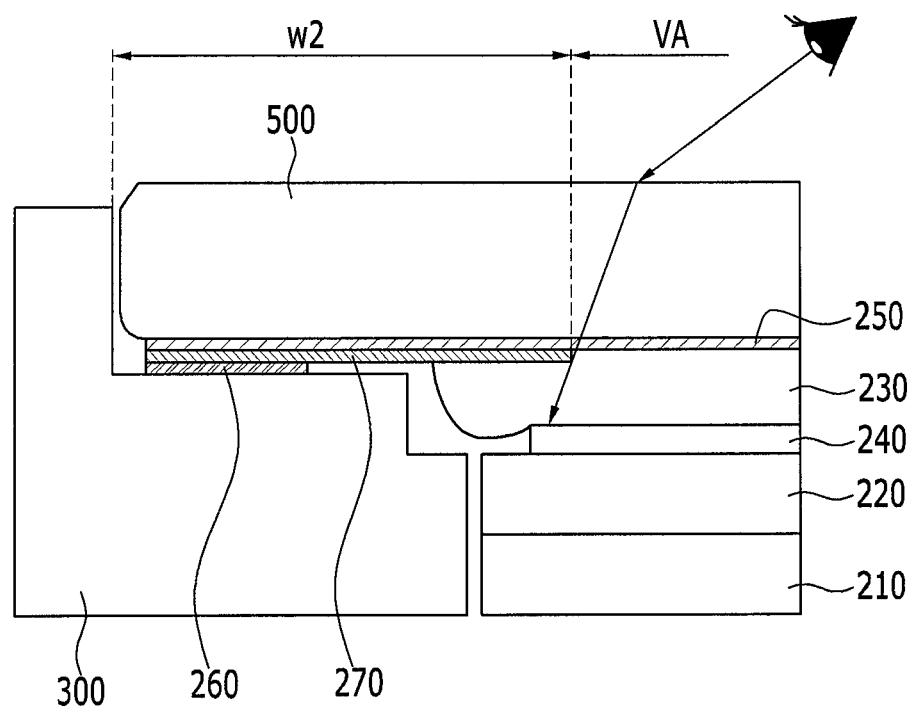
FIG. 3 is a partial cross-sectional view of the display device in which an edge of a polarizer is exposed outside.

However, even though the printing layer 270 is formed so that the inside of the display device is not exposed, as illustrated in FIG. 3, a lower portion of the printing layer 270 may be exposed. As a result, the edge of the polarizer 240 positioned below the resin layer 230 in the related art may be observed or exposed when viewed from the outside.

That is, as illustrated in FIG. 3, the edge of the polarizer 240 exists in a region W2 formed by the printing layer 270, but the edge of the polarizer 240 may be observed from (or exposed to) a user. As such, the edge of the polarizer 240 is observed from (or exposed to) the outside to be misrecognized as a defect in the display device.

In the related art, in order to solve the problem, there is a method of increasing a width of the region W2 formed by the printing layer 270, but the method does not correspond to a recent trend to reduce or minimize a width of the printing layer 270.

Accordingly, in order to solve the problem, according to an exemplary embodiment, the polarizer 240 is positioned on the resin layer 230, and an area of the polarizer 240 is largely increased.

In more detail, the area of the polarizer 240 is larger than areas of the resin layer 230 and the display panel 220. As illustrated in FIG. 4, the area of the polarizer 240 is formed to correspond to the area of the window 500. That is, the edge of the polarizer 240 may be positioned to correspond to the edge of the window 500.

As a result, the edge of the polarizer 240 positioned below the printing layer 270 may be blocked or prevented from being exposed, when obliquely viewed from the outside. Further, a width of the region W1 which is formed by the printing layer 270 may be reduced. That is, since the edge of the polarizer 240 is formed to correspond to the edge of the window 500, even though the width of the region W1 which is formed by the printing layer 270 is reduced, the edge of the polarizer 240 is not exposed.

Meanwhile, the supporter 300 is positioned to surround the display panel 220 and the resin layer 230. The supporter 300 may surround the display panel 220 and the like and support the window 500.

In this case, as illustrated in FIG. 4, the supporter 300 may support the edge of the polarizer 240 overlapping with the edge of the window 500.

The second adhesive layer 260 may be interposed between the supporter 300 and the polarizer 240. The second adhesive layer 260 may attach the supporter 300 and the polarizer 240 with each other. In this case, the second adhesive layer 260 may be formed in a double-sided tape.

Meanwhile, a display device according to another exemplary embodiment will be described with reference to FIG. 5. When describing the display device according to another exemplary embodiment, only a configuration different from the display device illustrated in FIG. 4 will be described in more detail, and the description of the duplicated configuration is omitted.

Referring to FIG. 5, the printing layer 270 is positioned below the polarizer 240. The printing layer 270 is positioned between the polarizer 240 and the resin layer 230. In more detail, the edge of the printing layer 270 is positioned between the polarizer 240 and the resin layer 230.

In this case, the printing layer 270 is positioned at an edge region of the window 500 and contacts the supporter 300. Finally, the second adhesive layer 260 is interposed between the printing layer 270 and the supporter 300.

Figure 6:
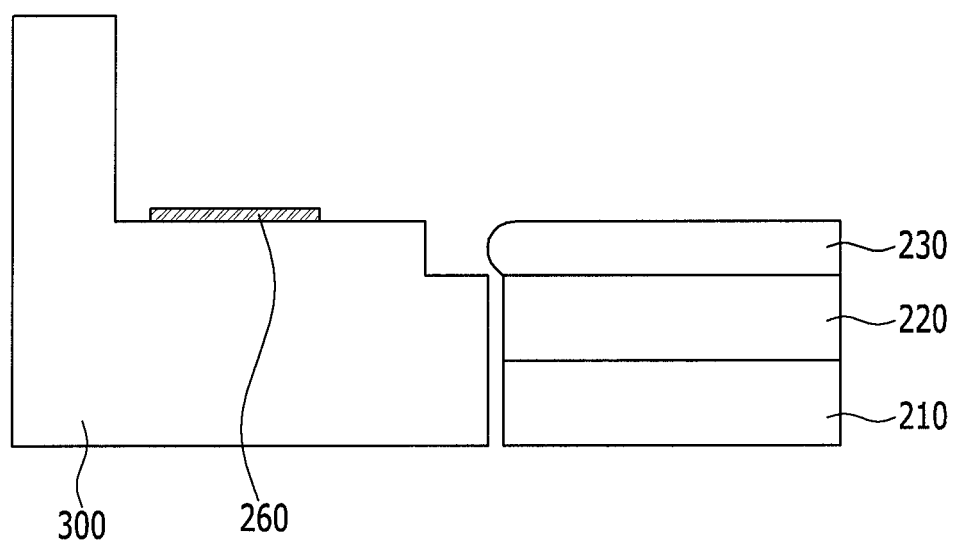
FIG. 6 is a cross-sectional view of the polarizer of FIG. 3.
Figure 7:
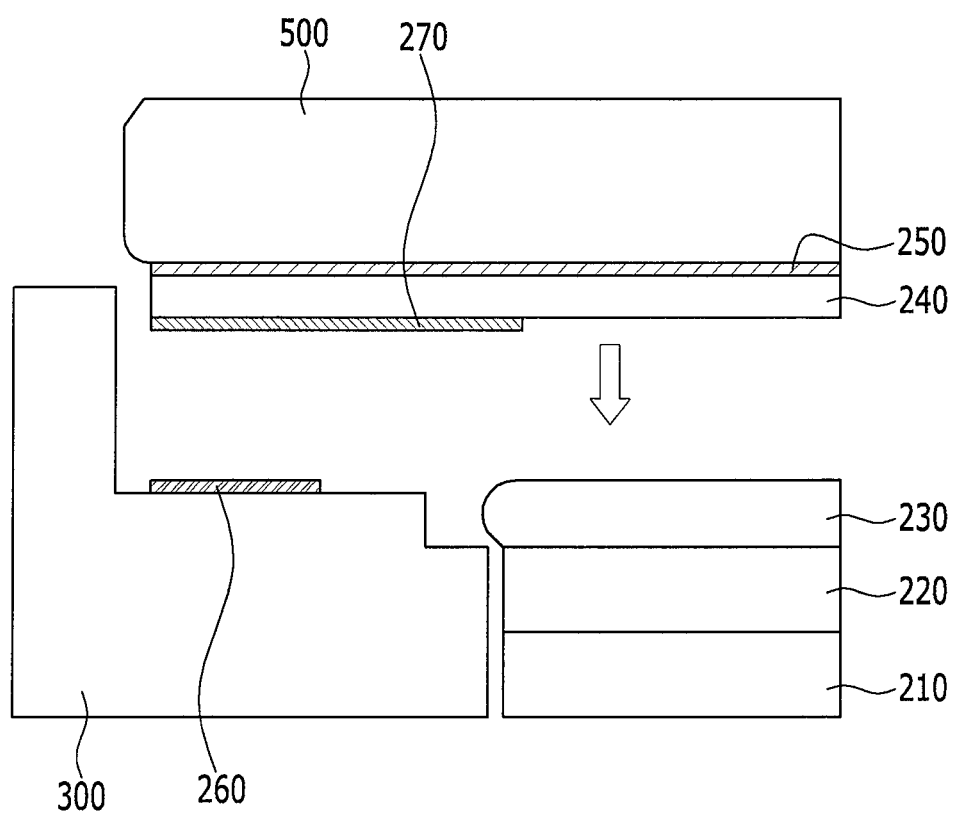
FIGS. 7 and 8 illustrate a manufacturing process of a display device according to an exemplary embodiment.

Next, a manufacturing method of a display device according to an exemplary embodiment will be described with reference to FIGS. 6 and 7.

First, the substrate 210 on which the display panel 220 may be formed is prepared.

In addition, the window 500 where the polarizer 240 is disposed on one side is prepared.

Next, the display panel 220 is formed on the substrate 210. As described above, the thin film transistor 130, the pixel (or first) electrode 160, the organic emission layer 170, the common (or second) electrode 180, the thin film encapsulation layer 141, and the like may be formed on the substrate 210.

In addition, the resin layer 230 is coated on the display panel 220. In this case, the resin layer 230 is coated in a liquid state.

Next, the substrate 210 and the display panel 220 are disposed inside the supporter 300. After the display panel 200 is disposed inside the supporter 300, the resin layer 230 may be coated on the display panel 200, and after the resin layer 230 is coated on the display panel 220, the display panel 220 may be disposed inside the supporter 300.

Thereafter, the window 500 to which the polarizer 240 is attached is bonded on the resin layer 230. In this case, the polarizer 240 is bonded so as to face the supporter 300 and the resin layer 230.

In this case, before the window 500 is bonded on the resin layer 230 and the supporter 300, the second adhesive layer 260 may be prepared on the supporter 300 in advance.

Next, the resin layer 230 is cured so that the window 500 is firmly attached on the display panel 220. In this case, the resin layer 230 may be cured by ultraviolet rays. However, a method of curing the resin layer 230 is not limited thereto, and may apply various known methods capable of curing the liquid resin.

The display device and the manufacturing method thereof according to the exemplary embodiment may prevent the edge of the polarizer covered by the printing layer from being exposed outside the display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents.

What is claimed is:

1. A display device, comprising:
   a substrate;
   a display panel on the substrate;
   a resin layer on the display panel;
   a polarizer on the resin layer;
   a window on the polarizer;
   a first adhesive layer between the window and the polarizer;
   a printing layer positioned either between the first adhesive layer and the polarizer or between the polarizer and the resin layer; and
   a supporter surrounding the display panel and the resin layer and supporting the window,
   wherein the printing layer is positioned to correspond to an edge region of the window,
   wherein an area of the polarizer corresponds to an area of the window, and
   wherein the area of the polarizer is larger than areas of the resin layer and the display panel.

2. The display device of claim 1, wherein:
   the polarizer is supported by the supporter.

3. The display device of claim 2, further comprising:
   a second adhesive layer between the polarizer and the supporter.

4. The display device of claim 3, wherein:
   the second adhesive layer is a double-sided tape.

5. The display device of claim 1, wherein:
   the display panel comprises an organic light emitting element.

6. The display device of claim 1, wherein:
   the first adhesive layer is an optical clear adhesive.

7. The display device of claim 1, wherein:
   the polarizer comprises a linear polarization member and a phase retardation film disposed below the linear polarization member.

8. The display device of claim 7, wherein:
   the phase retardation film is a $\lambda/4$ phase retardation film.

9. The display device of claim 8, wherein:
   the polarizer further comprises a first polarizer adhesive layer on the linear polarization member.

10. The display device of claim 9, wherein:
    the polarizer further comprises a second polarizer adhesive layer between the linear polarization member and the $\lambda/4$ phase retardation film.

* * * * *